(12) United States Patent
O et al.

(10) Patent No.: US 8,823,185 B2
(45) Date of Patent: Sep. 2, 2014

(54) SEMICONDUCTOR PACKAGES

(75) Inventors: In Won O, Jeonju-si (KR); Woojae Kim, Hwaseong-si (KR); YoungHoon Ro, Hwaseong-si (KR); HanShin Youn, Hwaseong-si (KR); Yechung Chung, Hwaseong-si (KR); YunSeok Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 152 days.

(21) Appl. No.: 13/244,326

(22) Filed: Sep. 24, 2011

(65) Prior Publication Data
US 2012/0168918 A1 Jul. 5, 2012

(30) Foreign Application Priority Data
Dec. 31, 2010 (KR) .......................... 10-2010-0139993

(51) Int. Cl.
*H01L 23/48* (2006.01)
*H01L 23/52* (2006.01)
*H01L 23/28* (2006.01)

(52) U.S. Cl.
USPC ............................. 257/784; 257/686; 257/701

(58) Field of Classification Search
USPC ........................ 257/676, 666, 701, 784, 786
See application file for complete search history.

(56) References Cited

U.S. PATENT DOCUMENTS

| 5,365,409 A * | 11/1994 | Kwon et al. ................. 361/813 |
| 5,844,307 A * | 12/1998 | Suzuki et al. ................. 257/690 |
| 2010/0258926 A1* | 10/2010 | Nishimura et al. ........... 257/676 |

FOREIGN PATENT DOCUMENTS

| KR | 10-2005-0079325 A | 8/2005 |
| KR | 10-2006-0006397 A | 1/2006 |

* cited by examiner

*Primary Examiner* — S. V. Clark
(74) *Attorney, Agent, or Firm* — Sughrue Mion, PLLC (57) ABSTRACT

Provided is a semiconductor package including: a semiconductor chip mounted on a die pad; at least one lead connected electrically to the semiconductor chip; and a flexible film substrate including a metal wiring, which electrically connects the semiconductor chip and the at least one lead, wherein the semiconductor chip is electrically connected to the film substrate through a first connection member which contacts the semiconductor chip and the metal wiring; and the film substrate is electrically connected to the at least one lead through a second connection member which contacts the metal wiring and the at least one lead.

19 Claims, 12 Drawing Sheets

SEMICONDUCTOR PACKAGES

CROSS-REFERENCE TO RELATED APPLICATION

This application claims priority under 35 U.S.C. §119 from Korean Patent Application No. 10-2010-0139993, filed on Dec. 31, 2010, the entire contents of which are hereby incorporated by reference.

BACKGROUND

Apparatuses and methods consistent with exemplary embodiments relate to semiconductor devices, and more particularly, to a semiconductor package.

Various packaging techniques for packaging integrated circuits have been developed in semiconductor industries to demands related to safety, miniaturization, and mounting reliability. For example, the demand for miniaturization has accelerated the technical development of packages which are close to a chip size and the demand for mounting reliability highlights the importance of developing a packaging technique which improves the efficiency of a mounting operation and the mechanical and electrical reliability after mounting.

SUMMARY

One or more embodiments described herein provide a semiconductor package with a reduced size.

One or more embodiments described herein provide a semiconductor package with a reduced manufacturing cost.

One or more embodiments described herein provide a semiconductor package with an improved operating speed.

According to an aspect of an exemplary embodiment, a semiconductor package includes: a semiconductor chip mounted on a die pad; at least one lead electrically connected to the semiconductor chip; and a flexible film substrate including a metal wiring which electrically connects the semiconductor chip and the at least one lead, wherein the semiconductor chip is electrically connected to the film substrate through a first connection member which contacts the semiconductor chip and the metal wiring; and the film substrate is electrically connected to the at least one lead through a second connection member which contacts the metal wiring and the at least one lead.

The film substrate may include a flexible polymer coating the metal wiring.

The film substrate may be disposed between the die pad and the semiconductor chip.

The semiconductor chip may be mounted on the die pad in a face up direction such that an active surface is opposite an inactive surface which faces the die pad; the first connection member may include a first bonding wire which electrically connects the active surface of the semiconductor chip and a first end of the metal wiring; and the second connection member may include one of a second bonding wire and a conductive film and electrically connects a second end of the metal wiring and the at least one lead.

The semiconductor chip may be mounted on the die pad in a face down direction such that an active surface faces the die pad; the first connection member may include a solder ball contacting the active surface and a first end of the metal wiring; and the second connection member may include one of a bonding wire and a conductive film and electrically connects the second end of the metal wiring and the at least one lead.

The semiconductor chip may include a plurality of chip pads, each of which is electrically connected to the first connection member; wherein at least two first connection members are commonly connected to a single lead of the at least one lead and at least two chip pads.

The first connection member may include a through electrode that vertically penetrates the semiconductor chip and contacts a first end of the metal wiring; and the second connection member may include one of a bonding wire and a conductive film and electrically connects a second end of the metal wiring and the at least one lead.

The film substrate may further include: a through hole through which the die pad is exposed; and a third connection may electrically connect the semiconductor chip to the die pad and may pass through the through hole.

The semiconductor chip may be mounted on the die pad in a face up direction such that an active surface is opposite at inactive surface which faces the die pad; and the third connection member may include a bonding wire that passes through the through hole and contacts the active surface and a top surface of the die pad.

The semiconductor chip may be mounted on the die pad in a face down direction such that an active surface faces the die pad; and the third connection member may include a solder ball which extends into the through hole and contacts the active surface and a top surface of the die pad.

The semiconductor chip may include a chip pad to which the first connection member is connected; and the film substrate may include a first substrate pad to which the first connection member is connected and a second substrate pad to which the second connection member is connected.

According to an aspect of another exemplary embodiment, a semiconductor package includes: a die pad providing a mounting region of a semiconductor chip; a semiconductor chip mounted on the die pad and molded by a molding layer; a flexible film substrate disposed between the die pad and the semiconductor chip, wherein the substrate includes a metal wiring coated by a polymer; at least one lead including an inner lead which is molded by the molding layer and an outer lead which extends from the inner lead and protrudes outside of the molding layer; a first connection member contacting which is electrically connected to a first end of the metal wiring and the semiconductor chip; a second connection member which is electrically connected to a second end of the metal wiring and the inner lead; and a third connection member which is electrically connected to the semiconductor chip and the die pad.

The film substrate may include a through hole through which the die pad is exposed and providing a path through which the third connection member passes from the semiconductor chip to the die pad.

The first connection member may be one of a first bonding wire, a first solder ball, and a through electrode; the second connection member may be one of a second bonding wire and a conductive film; and the third connection member may be one of a third bonding wire and a third solder ball.

The metal wiring may contact the first and second connection members to electrically connect the first connection member to the second connection member.

BRIEF DESCRIPTION OF THE DRAWINGS

The above and/or other aspects will become apparent and more readily appreciated from the following description of exemplary embodiments together with the accompanying drawings in which.

DETAILED DESCRIPTION OF THE EMBODIMENTS

Exemplary embodiments will be described below in more detail with reference to the accompanying drawings. Embodiments may, however, be embodied in different forms and should not be construed as limited by the description set forth herein. Like reference numerals refer to like elements throughout.

Figure 1A:
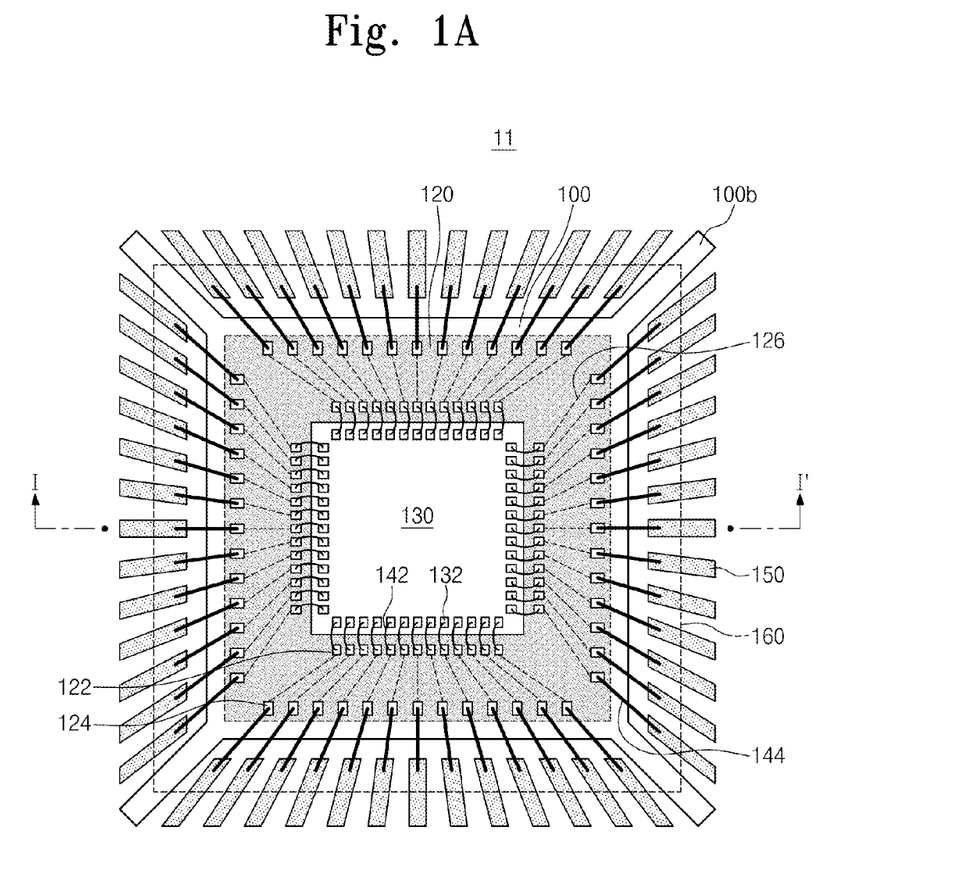
FIG. 1A is a plan view illustrating a semiconductor package according to an exemplary embodiment.
Figure 1B:
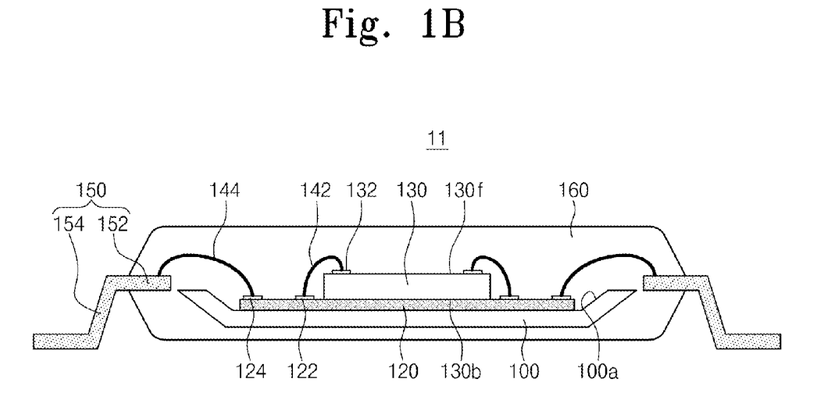
FIG. 1B is a cross-sectional view taken along the line I-I' of FIG. 1A.
Figure 1C:
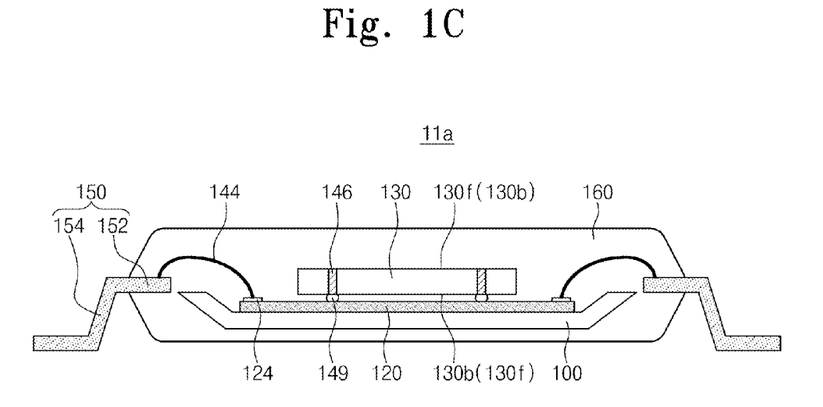
FIG. 1C is a cross-sectional view illustrating a modification of FIG. 1A.

FIG. 1A is a plan view illustrating a semiconductor package according to an exemplary embodiment. FIG. 1B is a cross-sectional view taken along the line I-I' of FIG. 1A. FIG. 1C is a cross-sectional view illustrating a modification of FIG. 1A.

Referring to FIGS. 1A and 1B, the semiconductor package 11 may include a die pad 100, a semiconductor chip 130 mounted on the die pad 100, leads 150 connected electrically to the semiconductor chip 130, a film substrate 120 with metal wirings 126 for providing electrical connections between the semiconductor chip 130 and the lead frame 150. The semiconductor package 11 may generally have a rectangular form.

The semiconductor package 11 may be molded by a molding layer 160. The molding layer 160 may be formed of an Epoxy Molding Compound (EMC). A portion 152 (hereinafter, referred to as an inner lead) of a lead 150 may be molded by the molding layer 160 and another portion 154 (hereinafter, referred to as an outer lead) may protrude toward the outside the molding layer 160. The inner lead 152 may be electrically connected to the semiconductor chip 130 and the outer lead 154 may be electrically connected to an external electrical device such as a main board or a module board. The semiconductor package 11 may be a Quad Flat Package where the leads 150 protrudes from all four sides of the semiconductor package 11.

The die pad 100 may provide a region on which the semiconductor chip 130 is mounted. As one example, the die pad 100 may have a rectangular form formed of an alloy of copper or iron and may include a tie bar 100b at each of its four corners. An area of the top surface 100a of the die pad 100 may be depressed, and the semiconductor chip 130 may be mounted in on the top surface 100a in the depressed area. As one example, the semiconductor chip 130 may be mounted in a face up state, in which the inactive surface 130b of the semiconductor chip 130 faces the die pad 100 and the its active surface 130f faces up. The semiconductor chip 130 may be a memory chip, a non-memory chip, or combinations thereof. The chip pad 132 may be prepared on the active surface 130f of the semiconductor chip 130.

The film substrate 120 may be interposed between the semiconductor chip 130 and the die pad 100. The film substrate 120 may be an electrical connection member in a thin film form, which is formed of a flexible polymer material such as polyimide to coat the metal wiring 126 and is easily bent, so that the film substrate 120 may connect the semiconductor chip 130 to the leads 150. The film substrate 120 may include a first substrate pad 122 connected to one end of an internal metal wiring 126 and a second substrate pad 124 connected to the other end of the metal wiring 126. The substrate pads 122 and 124 may be electrically connected to each other through the metal wiring 126. The first substrate pad 122 may be adjacent to the semiconductor chip 130 and the second substrate pad 124 may be adjacent to a lead 150. The film substrate 120 may be attached to the top surface 100a of the die pad 100 by an adhesive (not shown) and the semiconductor chip 130 may be disposed on the film substrate 130. An adhesive (not shown) may be further interposed between the semiconductor chip 130 and the film substrate 130. The adhesive may include Ag-epoxy or silicon based adhesive material.

An electrical connection between the semiconductor chip 130 and a lead 150 may be provided by the film substrate 120. As one example, the first bonding wire 142 contacting the first substrate pad 122 and the chip pad 132 may electrically connect the semiconductor chip 130 to the film substrate 120 and the second bonding wire 144 contacting the second substrate pad 124 and the inner lead 152 may electrically connect the film substrate 120 to a lead 150. If there is no film substrate 120, an electrical connection between the semiconductor chip 130 and the leads 150 may be provided by bonding wires (not shown) that contact the chip pads 132 and inner leads 152. However, according to this embodiment, since the metal wiring 126, instead of a bonding wire (not shown), is used to electrically connect the first substrate pad 122 to the second substrate pad 124, the length of bonding wires 142 and 144 between the semiconductor chip 130 and the leads 150 may be reduced. The length reduction of bonding wires 142 and 144 may make an electrical connection path shorter to prevent or minimize RC delay. Therefore, an operating speed of the semiconductor package 11 may be faster, defects of bonding wire manufacturing processes may be reduced, manufacturing costs may be decreased, and shorts between bonding wirings may be prevented.

As another example, as shown in FIG. 1C, an electrical connection between the semiconductor chip 130 and the film substrate 120 may be provided by an electrode 146 penetrating the semiconductor chip 130. The through electrode 146 may be electrically connected to the film substrate 120 through a direct contact or via a solder bump 149. The semiconductor chip 130 may be mounted on the die pad 100, with the active surface 130f facing upward in a face up state or with the active surface 130f facing downward in a face down (flip-chip) state. An electrical connection between the film substrate 120 and the inner lead 152 may be accomplished through the bonding wire 144 or a conductive film 180 of FIG. 4.

Figure 2A:
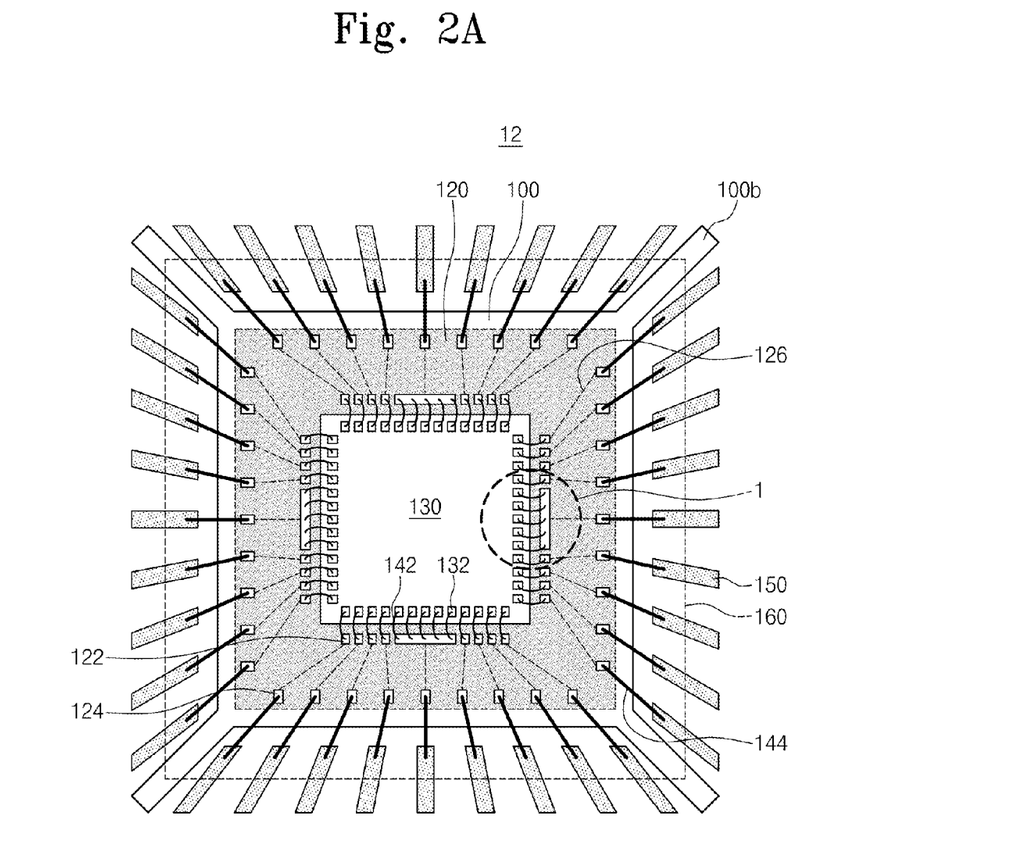
FIG. 2A is a plan view illustrating a semiconductor package according to an exemplary embodiment.
Figure 2B:
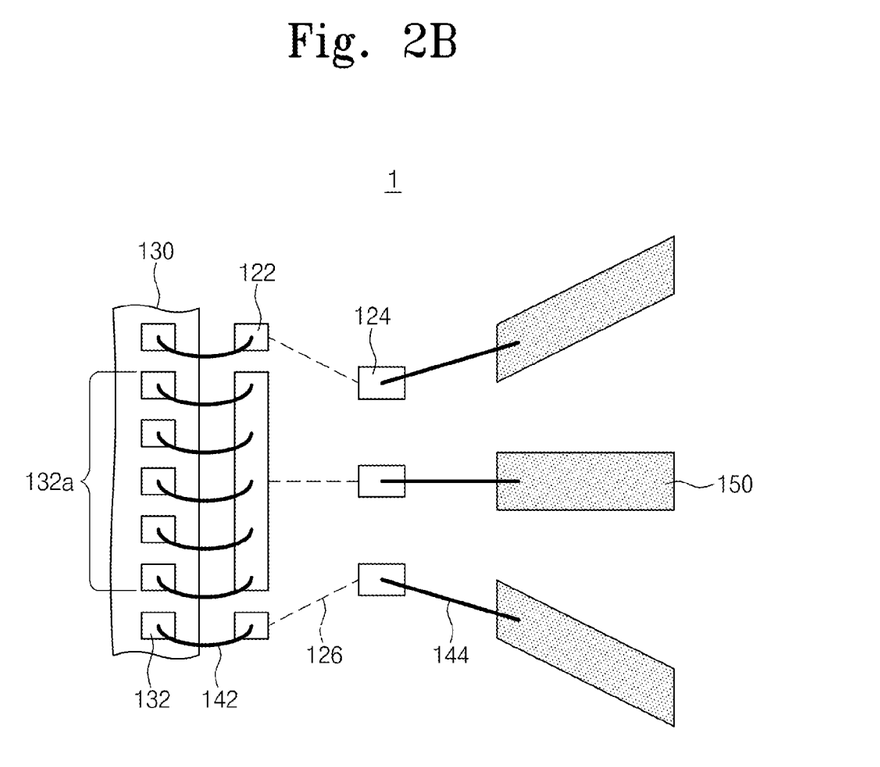
FIG. 2B is an enlarged plan view of a portion 1 of FIG. 2A.

FIG. 2A is a plan view illustrating a semiconductor package according to an embodiment. FIG. 2B is an enlarged plan view of a portion 1 of FIG. 2A.

Referring to FIGS. 2A and 2B, unlike the semiconductor package 11, the number of leads 150 may be reduced in a semiconductor package 12. For example, a plurality of first bonding wires 142 may be connected to at least two pads 132a, among the chip pads 132, which are used for the same electrical signal. A plurality of first bonding wires 142 may commonly contract one first substrate pad 122. Accordingly, the plurality of chip pads 132a used for the same electrical signal may be connected to one metal wiring 126 to be consequently connected to one lead 150. Thus, since the chip pads 132a used for the same electrical signal are connected to a single lead 150, the number of leads 150 may be reduced. As one example, when the N (e.g., 20) chip pads 132a among the M (e.g., 52) chip pads 132 are used for a power (or ground) signal, the number of leads 150 may be reduced from M to M-N (e.g., 36). Accordingly, the size of the semiconductor package 12 may be reduced. The above configuration may be applied to all embodiments disclosed in this specification.

FIGS. 3 through 8 are cross-sectional views illustrating semiconductor packages according to embodiments. Hereinafter, the differences with respect to the semiconductor package of FIG. 1A will be mainly described. Hereinafter, the disclosed distinctive features may be applied to all embodiments described in this specification.

Figure 3:
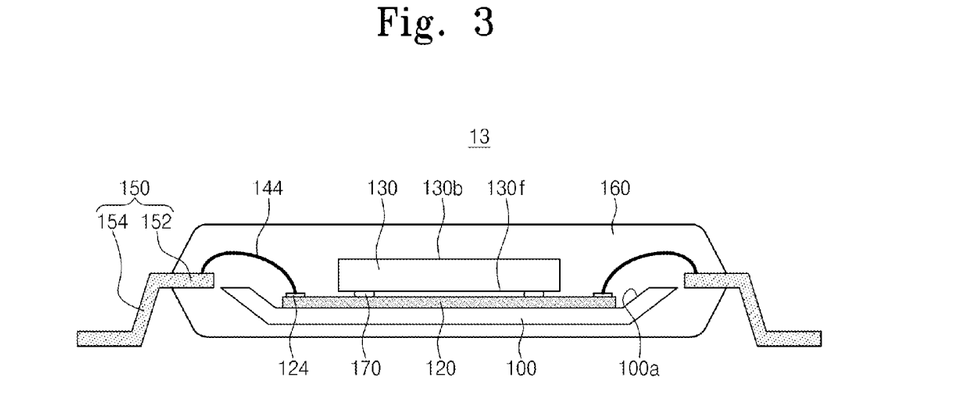
FIGS. 3 through 8 are cross-sectional views illustrating semiconductor packages according to exemplary embodiments.

Referring to FIG. 3, in relation to a semiconductor package 13, the semiconductor chip 130 may be mounted face down (i.e. flip-chip mounted), with the inactive surface 130b facing upward and the active surface 130f facing the die pad 100. The film substrate 120 and the semiconductor chip 130 may be electrically connected to each other through one or more solder balls 170, and the film substrate 120 and the inner lead 152 may be electrically connected to each other through the bonding wire 144. According to this embodiment, there may be no need to include a bonding wire between the semiconductor chip 130 and the film substrate 120, a shorter transfer path is created for an electrical signal as compared to using a bonding wire, and an operating speed of the semiconductor package 13 may be improved.

Figure 4:
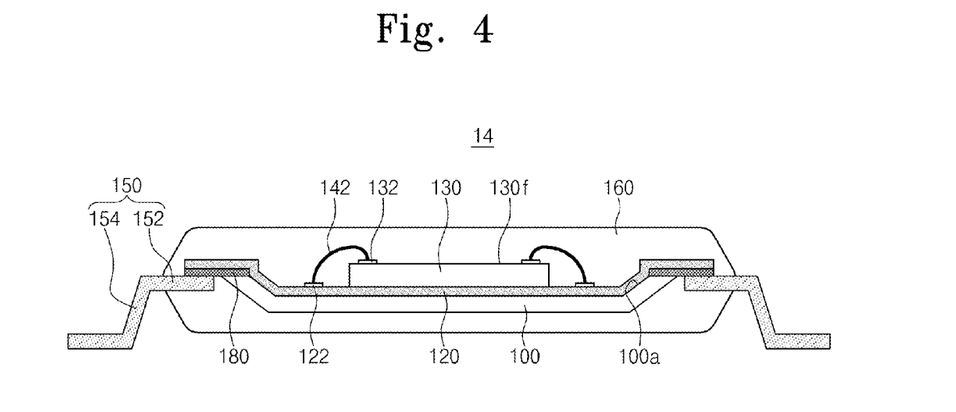

Referring to FIG. 4, in relation to a semiconductor package 14, the semiconductor chip 130 may be mounted on the die pad 100 face up, the semiconductor chip 130 and the film substrate 120 may be electrically connected to each other through the bonding wire 142, and the film substrate 120 and the inner lead 152 may be electrically connected to each other through a conductive film 180. An adhesive (not shown) may be interposed between the conductive film 152 and the die pad 100. Since the film substrate 120 is flexible, the film substrate 120 may be transformed to form a depressed area on the top surface 100a of the die pad 100, and the semiconductor chip may be attached thereon. According to this embodiment, identical or similar to the semiconductor package 13 depicted in FIG. 3, there may be no need to include a bonding wire between the film substrate 120 and the lead frame 150, and an operating speed may be improved.

Figure 5:
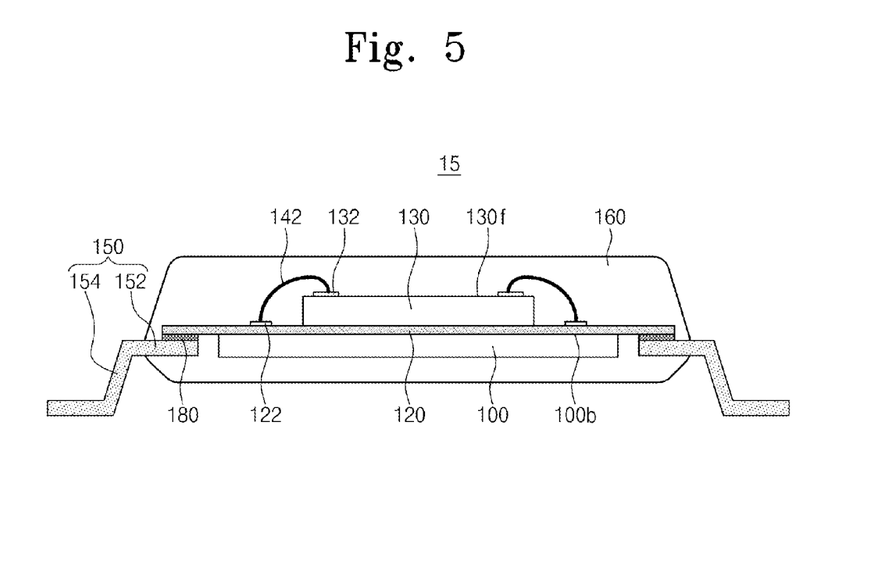

Referring to FIG. 5, a semiconductor package 15 may include the die pad 100 having a flat top surface 100b. The film substrate 120 may evenly extend to overlap with the inner lead 152 and may be electrically connected to the inner lead 152 by a conductive film 180. According to this embodiment, since the metal wiring 126 of FIG. 1A in the film substrate 120 does not bend, damage of the film substrate 120 due to the bending of the metal wiring 126 may be prevented.

Figure 6:
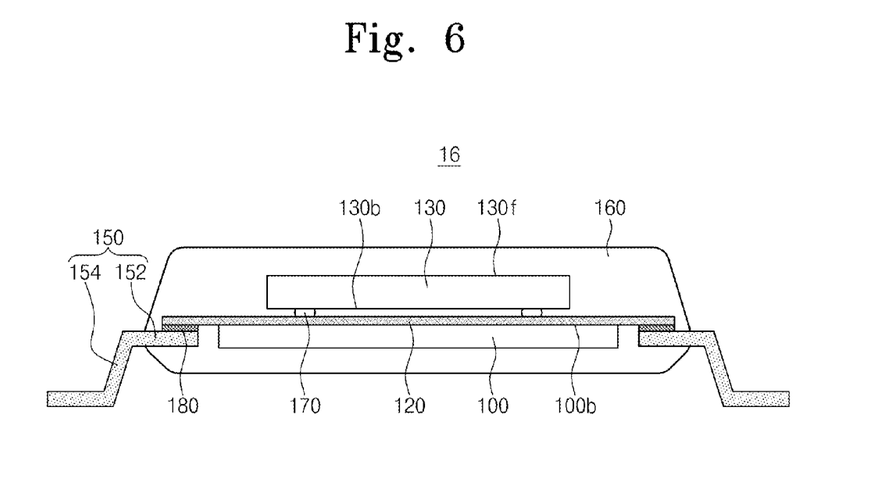

Referring to FIG. 6, a semiconductor package 16 may include the semiconductor chip 130 mounted face down (i.e. flip-chip mounted) on a flat surface 100b of the die pad 100. The film substrate 120 may be electrically connected to the inner lead 152 by the conductive film 180 that evenly extends to the inner lead 152. The semiconductor chip 130 and the film substrate 120 may be electrically connected to each other through the solder balls 170. According to this embodiment, since there is no need to include any bonding wires, no bonding process is needed. Since the semiconductor package 160 has a flip chip bonding structure, the semiconductor package 160 may operate at a faster speed as compared to a bonding wire structure.

Figure 7:
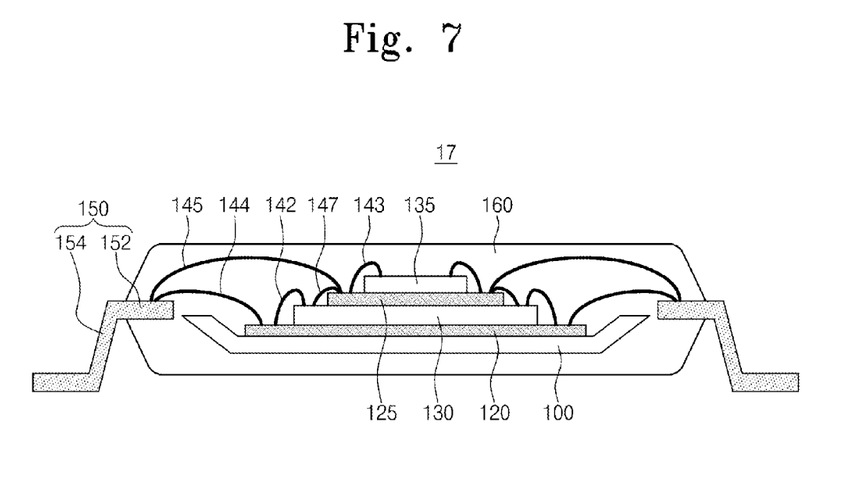

Referring to FIG. 7, a semiconductor package 17 may be a Multi Chip Package (MCP) in which a plurality of chips, for example, a first semiconductor chip 130 and a second semiconductor chip 135, are mounted on the die pad 100. The semiconductor chips 130 and 135 may be the same type of chip or may be different types of chips. As one example, one of the semiconductor chips 130 and 135 may be a memory chip and the other chip may be a non-memory chip. An electrical connection between the first semiconductor chip 130 and the lead frame 150 may be identical or similar to those connections illustrated in FIG. 1A. The second semiconductor chip 135 and the leads 150 may also be identical or similar to those illustrated in FIG. 1A. For example, the second semiconductor chip 125 may be stacked on the first semiconductor chip 130 and a second film substrate 125 may be interposed between the first semiconductor chip 130 and the second semiconductor chip 135. The second semiconductor chip 135 may be electrically connected to the second film substrate 125 by third bonding wires 143 and the second film substrate 125 may be electrically connected to the inner lead 152 by fourth bonding wires 145. The second film substrate 125 and the first semiconductor chip 130 may be electrically connected to each other by fifth bonding wires 147. Accordingly, the second semiconductor chip 135 may be electrically connected to the first semiconductor chip 130 through fifth bonding wires 147.

Figure 8:
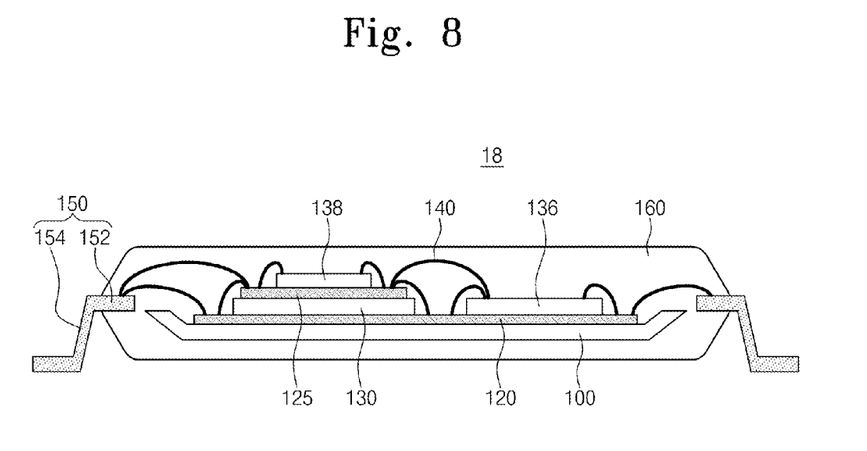

Referring to FIG. 8, a semiconductor package 18 may be a System-In-Package (SIP) in which different types of semiconductor chips 130, 136, and 138 are mounted on the die pad 100. For example, a first semiconductor chip 130 having a first function (e.g., a communication function) and a second semiconductor chip 136 having a second function (e.g., a central processing function) are mounted on the die pad 100 and a third semiconductor chip 138 having a third function (e.g., a memory function) may be stacked on the first semiconductor chip 130. A first film substrate 120 may be attached on the die pad 100 and a second film substrate 125 may be interposed between the first semiconductor chip 130 and the third semiconductor chip 125. Electrical connections between the semiconductor chips 130, 136, and 138 and/or electrical connections between the semiconductor chips 130, 136, and 138 and leads 150 may be established through a plurality of bonding wires 140.

Figure 9A:
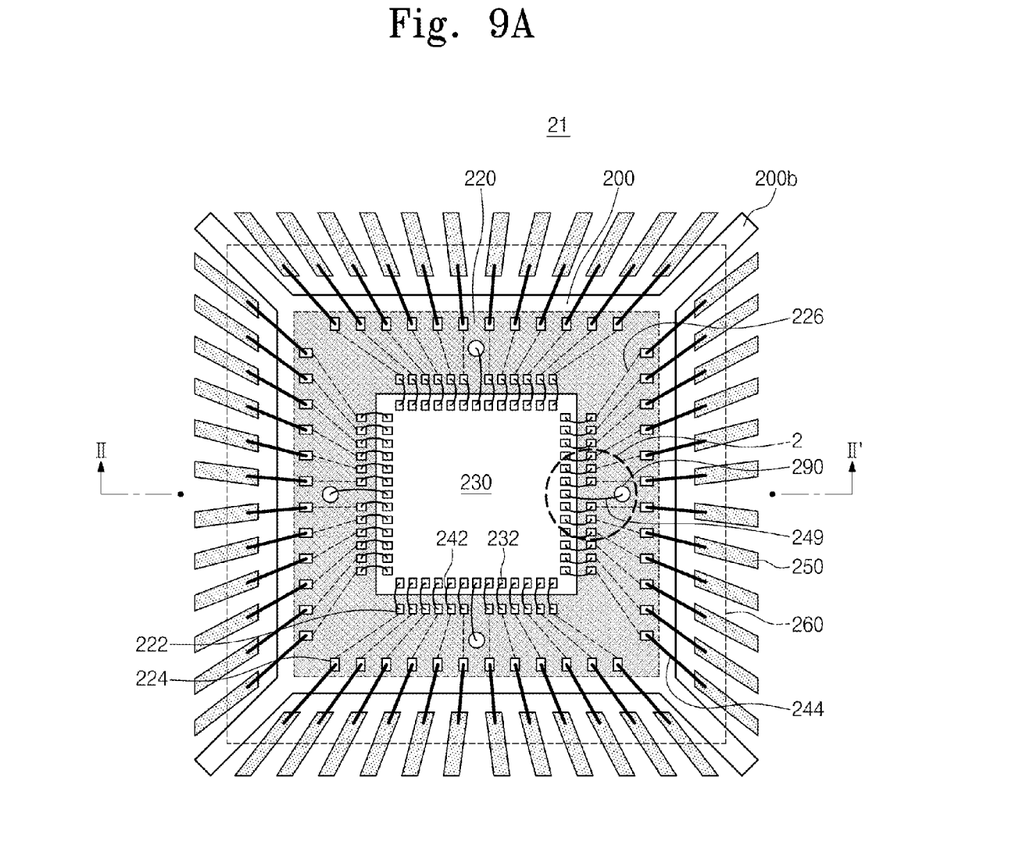
FIG. 9A is a plan view illustrating a semiconductor package according to an exemplary embodiment of the inventive concept.
Figure 9B:
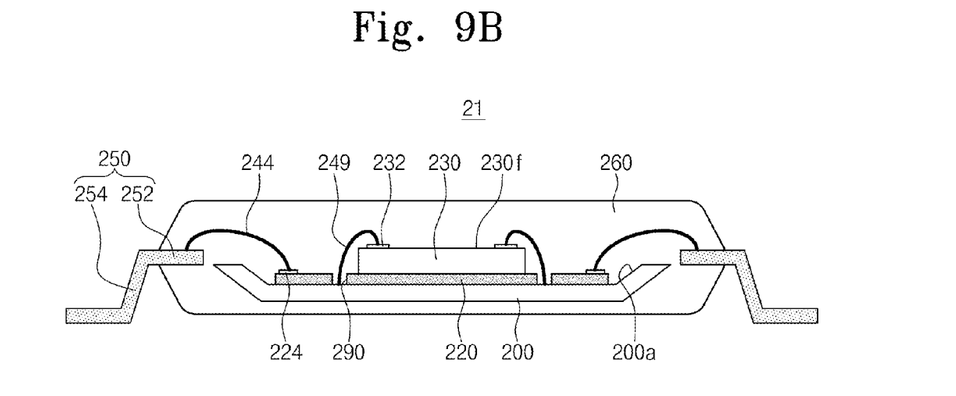
FIG. 9B is a cross-sectional view taken along the line II-II' of FIG. 9A.
Figure 9C:
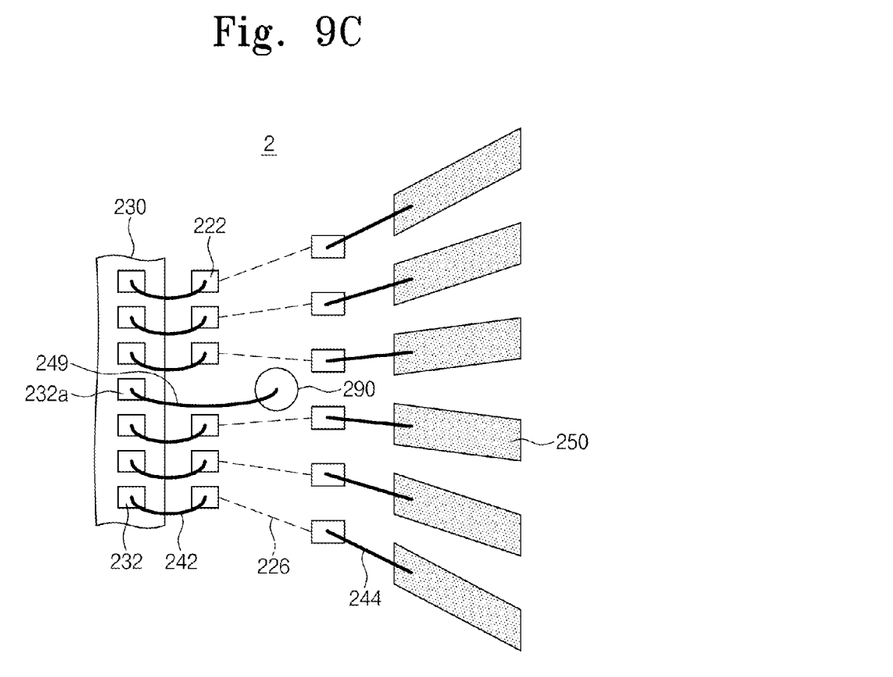
FIG. 9C is an enlarged plan view of a portion 2 of FIG. 9A.

FIG. 9A is a plan view illustrating a semiconductor package according to an embodiment. FIG. 9B is a cross-sectional view taken along the line II-II' of FIG. 9A. FIG. 9C is an enlarged plan view of a portion 2 of FIG. 9A.

Referring to FIGS. 9A and 9B, a semiconductor package 21 may be a Quad Flat Package (QFP) in which a semiconductor chip 230 is mounted on a top surface 200a of a die pad 200 face up; the semiconductor chip 230 and a lead frame 250 are electrically connected to each other by a film substrate 220 between the top surface 200a of the die pad 200 and the semiconductor chip 230; and a molding layer 260 is used for molding the semiconductor package 21.

The die pad 200 may have a rectangular outer circumference, a tie bar 200b may extend from each of the four corners, and the die pad may have a top surface 200a having a depressed area. As another example, the top surface 200a of the die pad 200 may be flat as shown in FIG. 5. The leads 250 may each be divided into an inner lead 252 (which is molded by the molding layer 260 and electrically connected to the semiconductor chip 230) and an outer lead 254 (which extends from the inner lead 252 and protrudes to the outside the molding layer 260 to connect to an external electrical device).

The semiconductor chip 230 and the film substrate 220 may be electrically connected to each other by first bonding wire wires, and the film substrate 220 and the leads 250 may be electrically connected to each other by second bonding wires 244. The first bonding wires 242 may each contact a chip pad 232 formed on an active surface 230f of the semiconductor chip 230 and a first substrate pad 222 formed on the film substrate 220. The second bonding wires 244 may each contact a second substrate pad 224 disposed on the film substrate 220 and the inner lead 252 of a lead 250. The first substrate pad 222 and the second substrate pad 224 may be electrically connected to each other through a metal wiring 226 buried in the film substrate 220. Accordingly, the semiconductor chip 220 may be electrically connected to the leads 250 through the first bonding wires 242, the metal wiring 256, and the second bonding wires 244. According to this embodiment, the die pad 200 may serve as a ground plate in addition to providing a region on which the semiconductor chip 230 is mounted.

Referring to FIGS. 9A through 9C, the semiconductor package 21 may include third bonding wires 249 which penetrates the film substrate 220 to electrically connect the die pad 200 to the semiconductor chip 230. Since the third bonding wires 249 are provided as transfer paths of a ground signal, the die pad 200 may serve as a ground plate. For example, the film substrate 220 may include a through hole 290 that exposes the top surface 200a of the die pad 200. A chip pad 232a of the plurality of chip pads 232 may serve as a pad for a ground signal. A third bonding wire 249 may have one end that contacts the top surface 200a of the die pad 200 and the other end that contacts a contact pad 232a of the semiconductor chip 230. The other end of the third bonding wire 249 may extend to pass through the through hole 290

Figure 10:
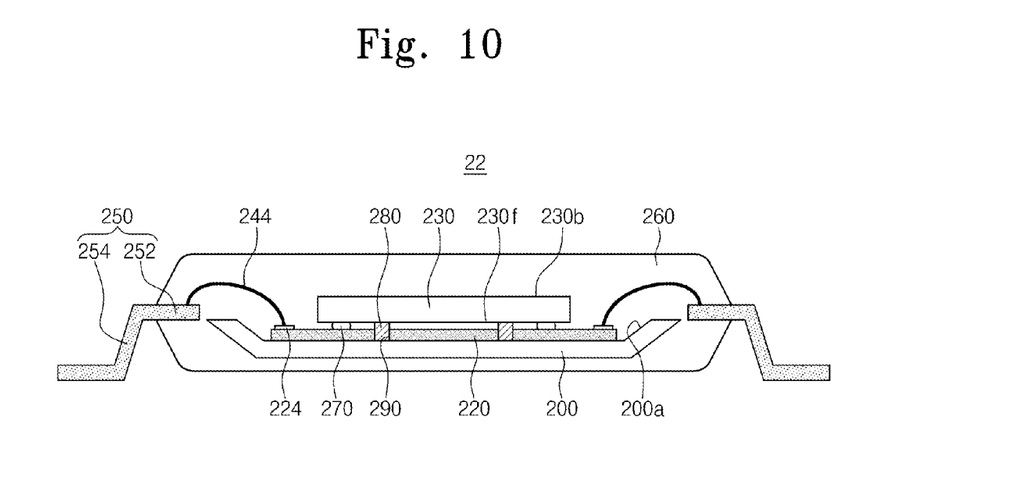
FIGS. 10 and 11 are cross-sectional views illustrating a semiconductor package according to an exemplary embodiment.
Figure 11:
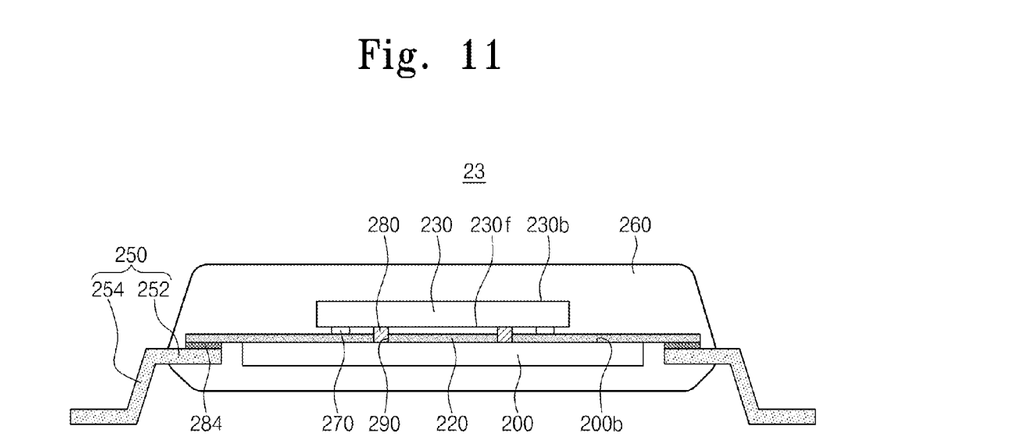

FIGS. 10 and 11 are cross-sectional views illustrating a semiconductor package according to an exemplary embodiment.

Referring to FIG. 10, a semiconductor package 22 may include the semiconductor chip 230 that is flip-chip bonded to the die pad 200. For example, the semiconductor chip 230 may be mounted face down on the top surface 200a of the die pad 200 such that an inactive surface 230b faces upward and the active surface 230f faces the top surface 200a of the die pad 200. The die pad 200 may have a top surface 200a including a depressed area. The semiconductor chip 230 may be electrically connected to the film substrate 220 through solder balls 270 and may be electrically connected to the lead frame 250 through bonding wires 244 contacting the film substrate 220 and the inner leads 252. The film substrate 220 may include one or more through holes 290 that expose the top surface 200a of the die pad 200. A solder ball 280 may provide a transfer path of a ground signal between the semiconductor chip 230 and the die pad 200 and may be inserted into a through hole 290. According to this embodiment, the die pad 220 may provide a mounting region for the semiconductor chip 220 and may also serve a ground plate.

Referring to FIG. 11, a semiconductor package 23 may include the semiconductor chip 230 mounted face down on the die pad 200 having a flat top surface 200b. The film substrate 220 may evenly extend to overlap with the inner leads 252 and may be electrically connected to the inner leads 252 by a conductive film 284. Besides that, the semiconductor package 23 may have an identical or similar configuration to the semiconductor package 22 of FIG. 10. According to this embodiment, since one or more bonding wires are not used for electrical connections, the semiconductor package 23 may operate at a faster speed.

Figure 12A:
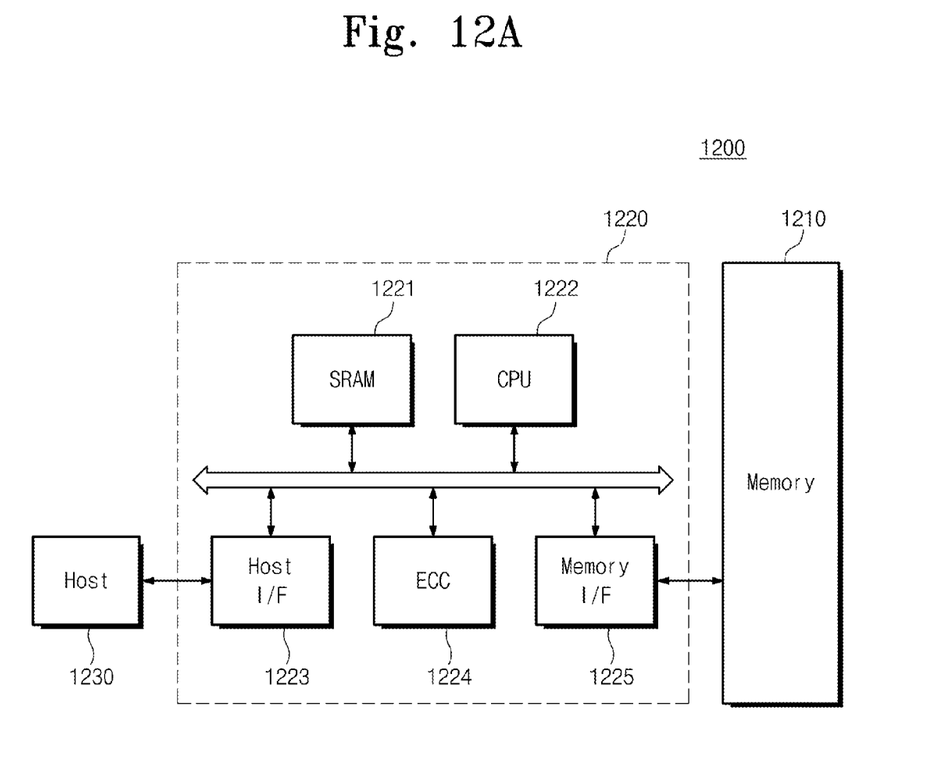
FIG. 12A is a block diagram illustrating a memory card with a semiconductor device according to exemplary embodiments.
Figure 12B:
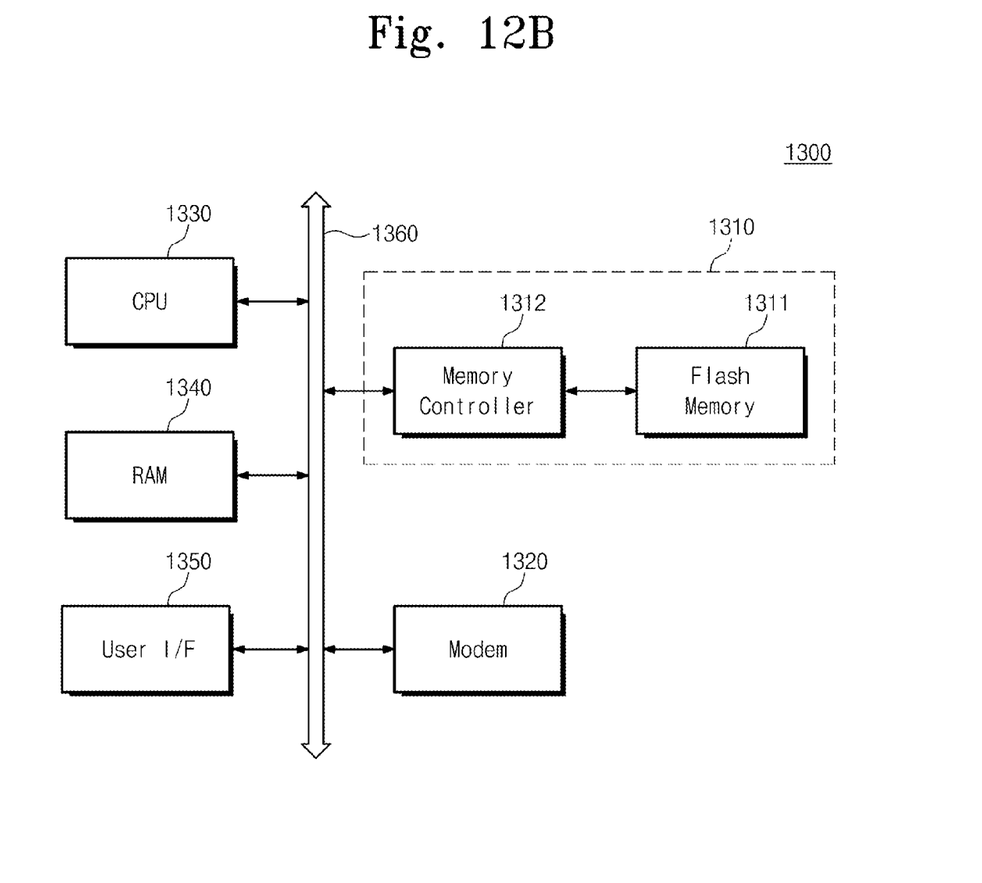
FIG. 12B is a block diagram illustrating an information processing system with an applied semiconductor package according to an exemplary embodiment.

FIG. 12A is a block diagram illustrating a memory card with a semiconductor device according to exemplary embodiments. FIG. 12B is a block diagram illustrating an information processing system with an applied semiconductor package according to an exemplary embodiment.

Referring to FIG. 12A, the semiconductor memory 1210 including a semiconductor package according to the above embodiments may be applied to the memory card 1200. As one example, the memory card 1200 may include a memory controller 1220 for controlling general data exchange between a host and a memory 1210. A SRAM 1221 may be used as an operating memory of a Central Processing Unit (CPU) 1222. A host interface 1223 may include a data exchange protocol of a host connected to the memory card 1200. An error correction code (ECC) 1224 may detect and correct errors in data read from the memory 1210. A memory interface 1225 interfaces with the memory 1210. The CPU may perform general control operations for data exchange of the memory controller 1220.

Referring to FIG. 12B, the information processing system 1300 may include a memory system 1300 with a semiconductor package according to an embodiment. The information processing system 1300 may include a mobile device or a computer. As one example, the information processing system 1300 may include a memory system 1310, a modem 1320, a CPU 1330, a RAM 1340, and an interface 1350, which are electrically connected to the system bus 1360. The memory system 1310 includes a memory 1311 and a memory controller 1312 and may have substantially the same configuration as the memory card 1200 of FIG. 12A. The memory system may store data processed by the CPU 1330 or data inputted from an external device. The information processing system 1300 may be provided as a memory card, a Solid State Disk (SSD), a camera image sensor, and other application chipsets. As one example, the memory system 1310 may include an SSD and in this case, the information processing system 1300 may stably and reliably store large capacity data in the memory system 1310.

According to the one or more exemplary embodiments, an electrical transfer path between a semiconductor chip and leads may be reduced. Compared to a long electrical transfer path, a short one may improve an operating speed of a semiconductor package, reduce defects during a wire bonding process, and improve electrical characteristics such as the reduction of an electrical short between bonding wires. Furthermore, according to exemplary embodiments, since the length of a bonding wire is reducible, a semiconductor package may be reduced and a manufacturing cost may be saved.

The above-disclosed exemplary embodiments are to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor package comprising:
a semiconductor chip mounted on a die pad;
at least one lead electrically connected to the semiconductor chip; and
a flexible film substrate, which is interposed between the semiconductor chip and the die pad, comprising a metal wiring which electrically connects the semiconductor chip and the at least one lead,
a first connection member which electrically connects the semiconductor chip and the metal wiring; and
a second connection member which electrically connects the metal wiring and the at least one lead,
wherein the first connection member comprises a through electrode that penetrates the semiconductor chip and electrically connects an active surface of the semiconductor chip to a first end of the metal wiring; and
the second connection member comprises one of a bonding wire and a conductive film, wherein the second connection member is electrically connected to a second end of the metal wiring and the at least one lead.

2. The semiconductor package of claim 1, wherein the film substrate comprises a flexible polymer coating the metal wiring.

3. The semiconductor package of claim 2, wherein the film substrate is disposed between the die pad and the semiconductor chip.

4. The semiconductor package of claim 1, wherein the semiconductor chip is mounted on the die pad in a face up direction such that an active surface of the semiconductor chip is opposite an inactive surface of the semiconductor chip which faces the die pad;
the first connection member comprises a first bonding wire electrically connected to the active surface of the semiconductor ship and a first end of the metal wiring; and
the second connection member comprises one of a second bonding wire and a conductive film, wherein the second connection member is electrically connected to a second end of the metal wiring and the at least one lead.

5. The semiconductor package of claim 1, wherein the semiconductor chip is mounted on the die pad in a face down direction such that an active surface of the semiconductor chip faces the die pad;
the first connection member comprises a solder ball which contacts the active surface of the semiconductor chip and a first end of the metal wiring; and
the second connection member comprises one of a bonding wire and a conductive film, wherein the second connection member is electrically connected to a second end of the metal wiring and the at least one lead.

6. The semiconductor package of claim 1, wherein the semiconductor chip comprises a plurality of chip pads which each contact the first connection member; and
at least two first connection members are commonly connected to a single lead of the at least one lead and at least two chip pads.

7. The semiconductor package of claim 1, wherein the film substrate further comprises:
a through hole which exposes the die pad therethrough; and
a third connection member which electrically connects the semiconductor chip to the die pad and passes through the through hole.

8. The semiconductor package of claim 7, wherein the semiconductor chip is mounted on the die pad in a face up direction such that an active surface of the semiconductor chip is opposite an inactive surface of the semiconductor chip which faces the die pad; and
the third connection member comprises a bonding wire that passes through the through hole and which is electrically connected to the active surface and a top surface of the die pad.

9. The semiconductor package of claim 7, wherein the semiconductor chip is mounted on the die pad in a face down direction such that an active surface of the semiconductor chip faces the die pad; and
the third connection member comprises a solder ball which extends into the through hole and is electrically connected to the active surface of the semiconductor chip and a top surface of the die pad.

10. The semiconductor package of claim 1, wherein the semiconductor chip comprises a chip pad to which the first connection member is connected; and
the film substrate comprises a first substrate pad to which the first connection member is connected and a second substrate pad to which the second connection member is connected.

11. A semiconductor package comprising:
a semiconductor chip mounted on a die pad and molded by a molding layer;
a flexible film substrate disposed between the die pad and the semiconductor chip, wherein the substrate comprises a metal wiring coated by a polymer;
at least one lead comprising an inner lead which is molded by the molding layer and an outer lead which extends from the inner lead and protrudes outside of the molding layer;
a first connection member which is electrically connected to a first end of the metal wiring and the semiconductor chip;
a second connection member which is electrically connected to a second other end of the metal wiring and the inner lead; and
a third connection member which is electrically connected to the semiconductor chip and the die pad.

12. The semiconductor package of claim 11, wherein the film substrate comprises a through hole through which the die pad is exposed, wherein the third connection member extends through the through hole.

13. The semiconductor package of claim 12, wherein the first connection member is one of a first bonding wire, a first solder ball, and a through electrode;
the second connection member is one of a second bonding wire and a conductive film; and
the third connection member is one of a third bonding wire and a third solder ball.

14. The semiconductor package of claim 11, wherein the metal wiring is electrically connected to the first connection member and the second connection member.

15. A semiconductor package comprising:
a die pad;
a substrate disposed on the die pad, the substrate comprising a metal wiring;
a semiconductor chip mounted on the substrate;
a plurality of leads;
a first connection member which comprises a through electrode that penetrates the semiconductor chip and electrically connects an active surface of the semiconductor chip to a first end of the metal wiring;

a second connection member which comprises one of a bonding wire and a conductive film and electrically connects a second end of the metal wiring to at least one of the plurality of leads;

a molding layer which encapsulates the die pad, the substrate, the semiconductor chip, the first connection member, the second connection member, and at least an inner portion of each of the plurality of leads, wherein the substrate is interposed between the die pad and the semiconductor chip.

16. The semiconductor package according to claim 15, wherein the die pad comprises a depressed inner portion, and the substrate is disposed in the depressed inner portion.

17. The semiconductor package according to claim 15, wherein the semiconductor chip is mounted on the substrate such that the active surface of the semiconductor chip faces away from the substrate.

18. The semiconductor package according to claim 15, wherein the semiconductor chip is mounted on the substrate such that the active surface of the semiconductor chip faces the substrate.

19. The semiconductor package according to claim 15, wherein the die pad comprises a flat top surface, and the substrate is disposed on the flat top surface.

* * * * *